United States Patent
Vaiyapuri

(10) Patent No.: US 6,869,827 B2
(45) Date of Patent: Mar. 22, 2005

(54) SEMICONDUCTOR/PRINTED CIRCUIT BOARD ASSEMBLY, AND COMPUTER SYSTEM

(75) Inventor: Venkateshwaran Vaiyapuri, Singapore (SG)

(73) Assignee: Micron Technology, Inc., Boise, ID (US)

(*) Notice: Subject to any disclaimer, the term of this patent is extended or adjusted under 35 U.S.C. 154(b) by 164 days.

(21) Appl. No.: 10/229,969

(22) Filed: Aug. 28, 2002

(65) Prior Publication Data

US 2003/0006496 A1 Jan. 9, 2003

Related U.S. Application Data

(62) Division of application No. 09/855,731, filed on May 15, 2001, now Pat. No. 6,507,107.

(30) Foreign Application Priority Data

Mar. 15, 2001 (SG) .......................... 200101609

(51) Int. Cl.[7] .............................. H01L 21/48
(52) U.S. Cl. ................ 438/109; 257/723; 438/107; 438/110
(58) Field of Search ............... 438/107, 109–110; 257/685–686, 723–724, 778

(56) References Cited

U.S. PATENT DOCUMENTS

| | | |
|---|---|---|
| 4,996,587 A | 2/1991 | Hinrichsmeyer et al. |
| 5,107,328 A | 4/1992 | Kinsman |
| 5,212,402 A | 5/1993 | Higgins, III |
| 5,247,423 A | 9/1993 | Lin et al. |
| 5,254,871 A | 10/1993 | Benavides et al. |
| 5,283,717 A | 2/1994 | Hundt |
| 5,334,875 A | 8/1994 | Sugano et al. |
| 5,444,296 A | 8/1995 | Kaul et al. |
| 5,463,253 A | 10/1995 | Waki et al. |
| 5,632,910 A | 7/1997 | Suzuki et al. |
| 5,646,828 A | 7/1997 | Degani et al. |
| 5,652,463 A | 7/1997 | Weber et al. |
| 5,656,856 A | 8/1997 | Kweon |

(List continued on next page.)

FOREIGN PATENT DOCUMENTS

| | | |
|---|---|---|
| JP | 59-48949 | 3/1984 |
| JP | 61-147559 | 7/1988 |
| JP | 02-158147 | 6/1990 |
| JP | 04-155857 | 5/1992 |
| JP | 5-343603 | 12/1993 |
| JP | 2001-577215 | 5/2001 |
| JP | 02001308140 | 11/2001 |
| WO | WO 97/37374 | 10/1997 |

OTHER PUBLICATIONS

"Multi–Chip Module on Laminate, High–performance packaging for today's silicon", IBM Microelectronics, 1998.

*Primary Examiner*—Allan R. Wilson
(74) *Attorney, Agent, or Firm*—Dinsmore & Shohl LLP

(57) ABSTRACT

A method of forming a computer system and a printed circuit board assembly, are provided comprising first and second semiconductor dies and an intermediate substrate. The intermediate substrate is positioned between the first active surface of the first semiconductor die and the second active surface of the second semiconductor die such that a first surface of the intermediate substrate faces the first active surface and such that a second surface of the intermediate substrate faces the second active surface. The second surface of the intermediate substrate includes a cavity defined therein. The intermediate substrate defines a passage therethrough. The second semiconductor die is secured to the second surface of the intermediate substrate within the cavity such that the conductive bond pad of the second semiconductor die is aligned with the passage.

13 Claims, 4 Drawing Sheets

U.S. PATENT DOCUMENTS

| | | |
|---|---|---|
| 5,674,785 A | 10/1997 | Akram et al. |
| 5,677,566 A | 10/1997 | King et al. |
| 5,808,878 A | 9/1998 | Saito et al. |
| 5,811,879 A | 9/1998 | Akram |
| 5,838,546 A | 11/1998 | Miyoshi |
| 5,898,224 A | 4/1999 | Akram |
| 5,952,611 A | 9/1999 | Eng et al. |
| 5,969,426 A | 10/1999 | Baba |
| 5,973,403 A | 10/1999 | Wark |
| 5,982,038 A | 11/1999 | Toy et al. |
| 5,994,166 A | 11/1999 | Akram et al. |
| 5,994,773 A | 11/1999 | Hirakawa |
| 6,005,778 A | 12/1999 | Spielberger et al. |
| 6,013,948 A | 1/2000 | Akram et al. |
| 6,020,629 A | 2/2000 | Farnworth et al. |
| 6,051,878 A | 4/2000 | Akram et al. |
| 6,081,023 A | 6/2000 | Murakami et al. |
| 6,087,717 A | 7/2000 | Ano et al. |
| 6,093,957 A | 7/2000 | Kwon |
| 6,093,969 A | 7/2000 | Lin |
| 6,118,176 A | 9/2000 | Tao et al. |
| 6,157,080 A | 12/2000 | Tamaki et al. |
| 6,181,002 B1 | 1/2001 | Juso et al. |
| 6,236,109 B1 | 5/2001 | Hsuan et al. |
| 6,262,488 B1 | 7/2001 | Masayuki et al. |
| 6,265,771 B1 | 7/2001 | Ference et al. |
| 6,300,163 B1 | 10/2001 | Akram |
| 6,303,981 B1 | 10/2001 | Moden |
| 6,316,727 B1 | 11/2001 | Liu |
| 6,335,566 B1 | 1/2002 | Hirashima et al. |
| 6,337,510 B1 | 1/2002 | Chun-Jen et al. |
| 6,388,336 B1 | 5/2002 | Venkateshwaran et al. |
| 6,407,456 B1 | 6/2002 | Ball |
| 6,507,098 B1 * | 1/2003 | Lo et al. ............. 257/686 |
| 6,646,334 B2 | 11/2003 | Hur |
| 6,707,141 B2 * | 3/2004 | Akram ............... 257/686 |
| 2001/0015485 A1 | 8/2001 | Song et al. |
| 2002/0074668 A1 | 6/2002 | Hofstee et al. |
| 2002/0079567 A1 | 6/2002 | Lo et al. |
| 2002/0079573 A1 | 6/2002 | Akram |

* cited by examiner

SEMICONDUCTOR/PRINTED CIRCUIT BOARD ASSEMBLY, AND COMPUTER SYSTEM

CROSS-REFERENCE TO RELATED APPLICATIONS

The present application is a division of U.S. patent application Ser. No. 09/855,731, filed May 15, 2001 now U.S. Pat. No. 6,507,107.

The present application is also related to U.S. patent application Ser. Nos. 09/992,580, filed Nov. 16, 2001 which is a division of 09/804,421, filed Mar. 12, 2001; 09/804,051, filed Mar. 12, 2001; and 09/803,045, filed Mar. 12, 2001.

BACKGROUND OF THE INVENTION

The present invention relates to stacked multiple die semiconductor assemblies, printed circuit board assemblies, computer systems, and their methods of assembly. More particularly, the present invention relates to an improved scheme for increasing semiconductor die density.

Conventional Chip On Board (COB) techniques used to attach semiconductor dies to a printed circuit board include flip chip attachment, wirebonding, and tape automated bonding ("TAB"). Flip chip attachment consists of attaching a flip chip to a printed circuit board or other substrate. A flip chip is a semiconductor chip that has a pattern or array of electrical terminations or bond pads spaced around an active surface of the flip chip for face down mounting of the flip chip to a substrate. Generally, the flip chip has an active surface having one of the following electrical connectors: Ball Grid Array ("BGA")—wherein an array of minute solder balls is disposed on the surface of a flip chip that attaches to the substrate ("the attachment surface"); Slightly Larger than Integrated Circuit Carrier ("SLICC")—which is similar to a BGA, but having a smaller solder ball pitch and diameter than a BGA; or a Pin Grid Array ("PGA")—wherein an array of small pins extends substantially perpendicularly from the attachment surface of a flip chip. The pins conform to a specific arrangement on a printed circuit board or other substrate for attachment thereto.

With the BGA or SLICC, the solder or other conductive ball arrangement on the flip chip must be a mirror-image of the connecting bond pads on the printed circuit board such that precise connection is made. The flip chip is bonded to the printed circuit board by refluxing the solder balls. The solder balls may also be replaced with a conductive polymer. With the PGA, the pin arrangement of the flip chip must be a mirror-image of the pin recesses on the printed circuit board. After insertion, the flip chip is generally bonded by soldering the pins into place. An under-fill encapsulant is generally disposed between the flip chip and the printed circuit board for environmental protection and to enhance the attachment of the flip chip to the printed circuit board. A variation of the pin-in-recess PGA is a J-lead PGA, wherein the loops of the J's are soldered to pads on the surface of the circuit board.

Wirebonding and TAB attachment generally begin with attaching a semiconductor chip to the surface of a printed circuit board with an appropriate adhesive, such as an epoxy. In wirebonding, bond wires are attached, one at a time, to each bond pad on the semiconductor chip and extend to a corresponding lead or trace end on the printed circuit board. The bond wires are generally attached through one of three industry-standard wirebonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts. The semiconductor chip may be oriented either face up or face down (with its active surface and bond pads either up or down with respect to the circuit board) for wire bonding, although face up orientation is more common. With TAB, ends of metal leads carried on an insulating tape such as a polyamide are respectively attached to the bond pads on the semiconductor chip and to the lead or trace ends on the printed circuit board. An encapsulant is generally used to cover the bond wires and metal tape leads to prevent contamination.

Higher performance, lower cost, increased miniaturization of components, and greater packaging density of integrated circuits are ongoing goals of the computer industry. As new generations of integrated circuit products are released, the number of devices used to fabricate them tends to decrease due to advances in technology even though the functionality of these products increases. For example, on the average, there is approximately a 10 percent decrease in components for every product generation over the previous generation with equivalent functionality.

In integrated circuit packaging, in addition to component reduction, surface mount technology has demonstrated an increase in semiconductor chip density on a single substrate or board despite the reduction of the number of components. This results in more compact designs and form factors and a significant increase in integrated circuit density. However, greater integrated circuit density is primarily limited by the space or "real estate" available for mounting dies on a substrate, such as a printed circuit board.

U.S. Pat. Nos. 5,994,166 and 6,051,878, the disclosures of which are incorporated herein by reference, represent a number of schemes for increasing semiconductor chip density on a single substrate or board. Despite the advantages of the most recent developments in semiconductor fabrication there is a continuing need for improved schemes for increasing semiconductor die density in printed circuit board assemblies.

BRIEF SUMMARY OF THE INVENTION

This need is met by the present invention wherein an improved semiconductor die assembly scheme is provided. In accordance with one embodiment of the present invention, a multiple die semiconductor assembly is provided comprising first and second semiconductor dies, and an intermediate substrate. The first semiconductor die defines a first active surface including at least one conductive bond pad. The second semiconductor die defines a second active surface including at least one conductive bond pad. The intermediate substrate is positioned between the first active surface of the first semiconductor die and the second active surface of the second semiconductor die such that a first surface of the intermediate substrate faces the first active surface and such that a second surface of the intermediate substrate faces the second active surface. The first semiconductor die is electrically coupled to the intermediate substrate by at least one topographic contact extending from the first active surface to the first surface of the intermediate substrate. The second surface of the intermediate substrate includes a cavity defined therein. The intermediate substrate defines a passage there through. The second semiconductor die is secured to the second surface of the intermediate substrate within the cavity such that the conductive bond pad of the second semiconductor die is aligned with the passage.

The second semiconductor die is electrically coupled to the intermediate substrate by at least one conductive line extending from the conductive bond pad of the second semiconductor die through the passage defined in the intermediate substrate and to a conductive contact on the first surface of the intermediate substrate.

Accordingly, it is an object of the present invention to provide an improved semiconductor die assembly scheme. Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION

Figure 1:
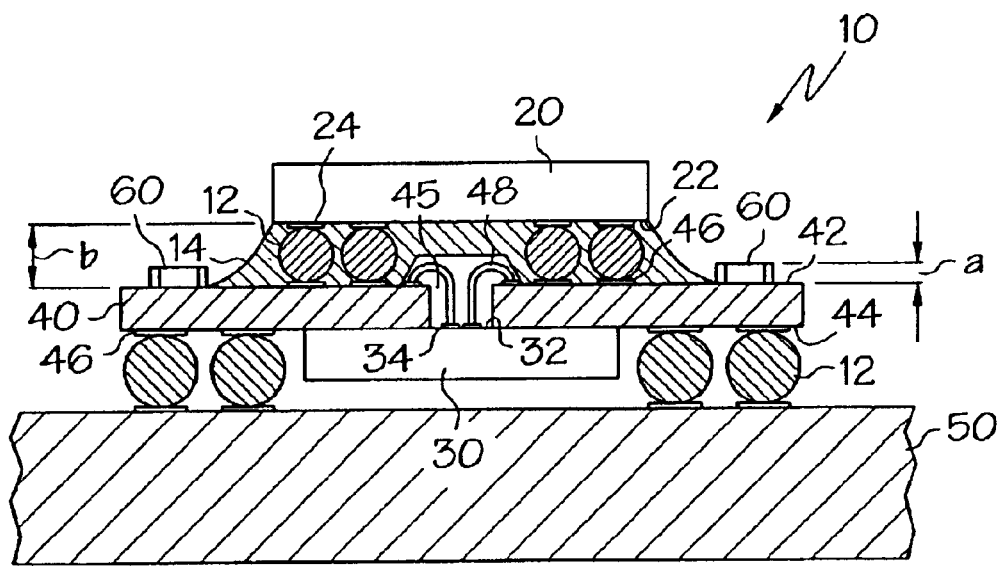
FIGS. 1–8 are cross sectional schematic illustrations of a variety of printed circuit board assemblies according to the present invention.

Referring initially to FIG. 1, a printed circuit board assembly 10 is provided comprising a first semiconductor die 20, a second semiconductor die 30, an intermediate substrate 40, a printed circuit board 50, and a pair of decoupling capacitors 60. As will be appreciated by those practicing the present invention, the printed circuit board assembly 10 is typically provided a part of a computer system. In specific applications of the present invention, the semiconductor dies may form an integrated memory unit but may embody a variety of alternative integrated circuit functions.

The first semiconductor die 20 defines a first active surface 22. The first active surface 22 includes one or more conductive bond pads 24. The second semiconductor die 30 defines a second active surface 32. The second active surface 32 including one or more conductive bond pads 34. For the purposes of describing and defining the present invention, it is noted that a conductive bond pad comprises a conductive surface area defined on or extending from a surface of a semiconductor die. A conductive contact comprises a conductive surface area defined on or extending from a substrate. An active surface comprises a surface of a die or substrate that contains conductive contacts or conductive bond pads.

The intermediate substrate 40 is positioned between the first active surface 22 of the first semiconductor die 20 and the second active surface 32 of the second semiconductor die 30 such that a first surface 42 of the intermediate substrate 40 faces the first active surface 22 and such that a second surface 44 of the intermediate substrate 40 faces the second active surface 32. For reasons illustrated in further detail herein, the intermediate substrate 40 defines a passage 45 extending from the first surface 42 of the intermediate substrate 40 to the second surface 44 of the intermediate substrate 40. The intermediate substrate 40 further includes a network of conductive contacts 46 formed thereon. As is described in further detail herein the conductive contacts 46, which may embody printed conductive lines, wires, traces, and combinations thereof, electrically couple the various components of the printed circuit board assembly 10 to the printed circuit board 50 and to each other. For the purposes of defining and describing the present invention when reference is made herein to electrical coupling to a substrate or other structure, it is understood that the electrical coupling includes electrical coupling to a contact on a surface of the substrate or other structure. It is also noted that electrical coupling need not be direct and may include coupling through one or more circuitry components.

In the embodiment illustrated in FIG. 1, the first semiconductor die 20 comprises a flip chip and is electrically coupled to the intermediate substrate 40 by a plurality of topographic contacts 12 extending from the first active surface 22 to the first surface 42 of the intermediate substrate 40. For the purposes of describing and defining the present invention, it is noted that a flip chip comprises a semiconductor die arranged relative to a substrate such that conductive bond pads included in an active surface thereof are aligned with conductive contacts on an opposing surface of the intermediate substrate. In the embodiment of FIG. 1, the conductive bond pads 24 included in the first active surface 22 are aligned with conductive contacts 46 on the first surface 42 of the intermediate substrate 40. It is further noted that a topographic contact comprises any conductive contact that extends between and defines a spacing between an active surface of a substrate or die and an active surface of another substrate or die. Examples include solder balls, conductive polymers, or other types of topographic electrical connections. A pin grid array, where pin recesses are provided in the opposing surface, present a suitable alternative to topographic contacts, where it is not necessary to create a spacing between two surfaces for accommodating structure there between.

Referring further to FIG. 1, the second semiconductor die 30 comprises a stacked chip secured to the second surface 44 of the intermediate substrate 40 such that the conductive bond pads 34 of the second semiconductor die 30 are aligned with the passage 45. The second semiconductor die 30 is electrically coupled to the intermediate substrate 40 by one or more conductive lines 48 extending from the conductive bond pad 34 of the second semiconductor die 30 through the passage 45 defined in the intermediate substrate 40 and to a conductive contact 46 on the first surface 42 of the intermediate substrate 40. For the purposes of describing and defining the present invention, it is noted that a stacked chip comprises a semiconductor die that is stacked upon a major surface of a substrate or that defines a major surface that is secured to a major surface of a substrate. A conductive line may comprise an electrically conductive lead, trace, bond wire, etc. A printed circuit board comprises a substrate upon which a circuit, network, or plurality of electrically conductive areas are formed.

It noted that the manner in which the first and second semiconductor dies 20, 30 are electrically coupled to the printed circuit board 50 may vary. For example, electrically conductive traces or other conductors may be provided in the intermediate substrate 40 such that one of the semiconductor dies 20, 30 may be electrically coupled to the intermediate substrate 40 through the other die or independent of the other die. It may be advantageous in particular applications of the present invention to electrically connect the first and second dies 20, 30 to each other or to electrically isolate the dies 20 and 30 from each other. In either case, suitable trace lines or other conductive lines are provided to at least ensure an electrical connection between each die and the printed circuit board 50.

The decoupling capacitors 60 are mounted to the first surface 42 of the intermediate substrate 40 and are conductively coupled to the first and second semiconductor dies 20, 30. Specifically, according to one aspect of the present invention, each decoupling capacitor 60 is placed in an electrical circuit between the high and low voltage inputs (e.g., $V_{SS}$ and $V_{CC}$) of one of the dies 20, 30. In this manner, the decoupling capacitors 60 decouple the low voltage input from the high voltage input and serves as a power source filter or surge/spike suppressor. Preferably, each decoupling capacitor 60 is placed as close as possible or practical to the semiconductor dies 20, 30.

The thickness dimension a of each decoupling capacitor 60 is accommodated in a space defined by a thickness dimension b of the topographic contacts 12 conductively coupled to the conductive contact 46 on the first surface 42 of the intermediate substrate 40.

The printed circuit board assembly 10 illustrated in FIG. 1 may further comprise a conventional underfill material 14 formed between the first semiconductor die 20 and the first surface 42 of the intermediate substrate 40. As will be appreciated by those familiar with semiconductor fabrication underfill materials are generally disposed between flip chips and the printed circuit board or substrate to which they are mounted for environmental protection and to enhance the attachment of the flip chip to the printed circuit board or substrate. In addition, an encapsulant 16 may be formed over the first semiconductor die 20 and the first surface 42 of the intermediate substrate 40. The encapsulant 16 may be used in place of the underfill material 14 and may also be formed over the second semiconductor die 30. A die attach adhesive 18 (illustrated in FIG. 8) may be positioned to secure the second semiconductor die 30 to the second surface 44 of the intermediate substrate 40. As will be appreciated by those practicing the present invention, the encapsulant and underfill configurations illustrated herein with reference to FIG. 1 may also be employed in the embodiments of FIGS. 2–8.

Figure 2:
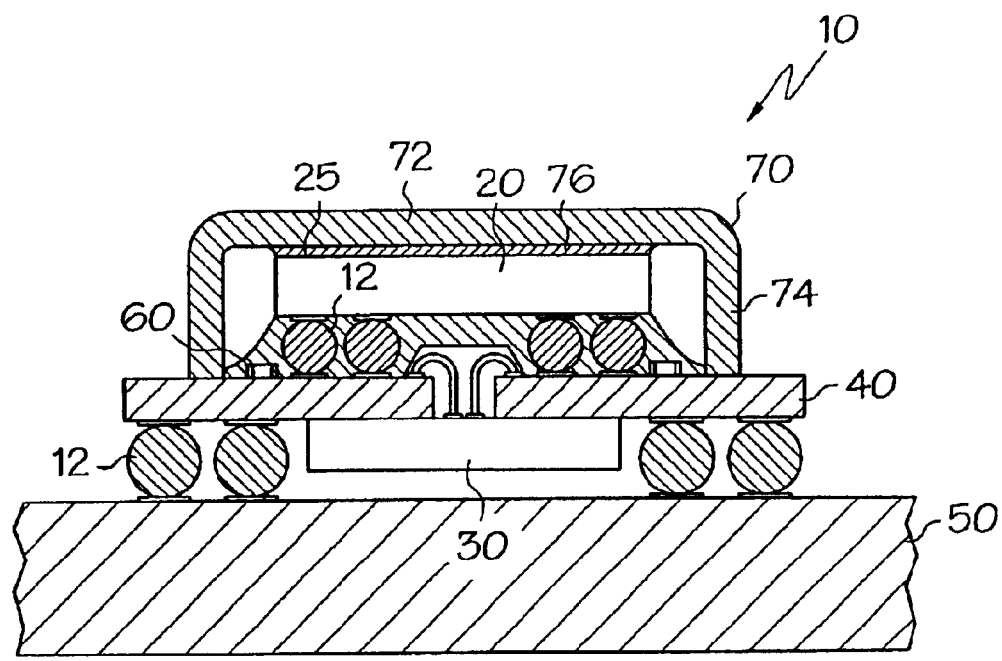

In the embodiment illustrated in FIG. 2, a heat sink 70 including a cap portion 72 and a peripheral portion 74 is provided. The cap portion 72 is thermally coupled to a major surface 25 of the first semiconductor die 20 via a layer of heat sink compound 76, which preferably provides some adhesion between the heat sink 70 and the die 20. The peripheral portion 74 engages a mounting zone defined by a lateral dimension of the intermediate substrate 40 extending beyond the periphery of the first semiconductor die 20.

Figure 3:
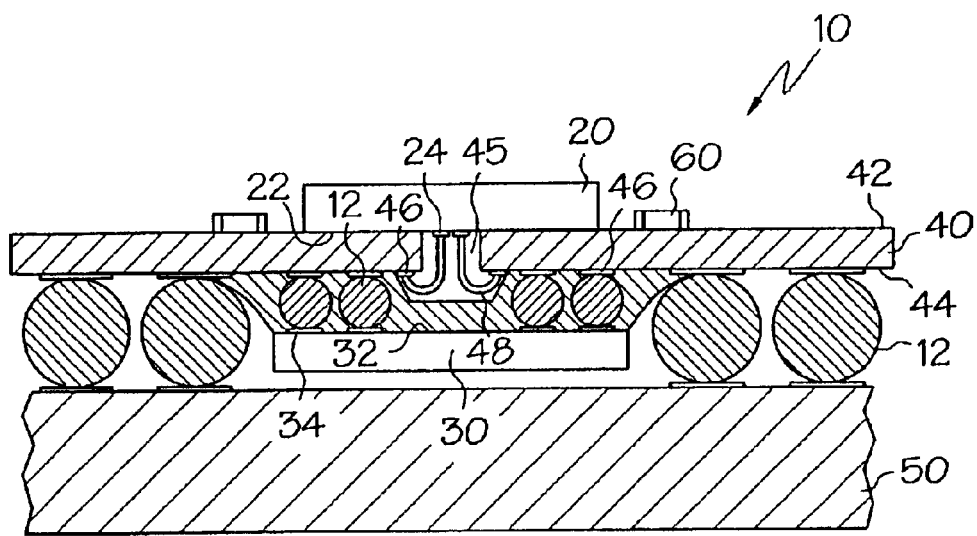

In the embodiment of FIG. 3, the first semiconductor die 20 comprises a stacked chip secured to the first surface 42 of the intermediate substrate 40 such that the conductive bond pads 24 on the first active surface 22 are aligned with the passage 45. Conductive lines 48 extend from the conductive bond pads 24 on the first active surface 22 to conductive contacts 46 on the second surface 44 of the intermediate substrate 40. The second semiconductor die 30 comprises a flip chip arranged relative to the intermediate substrate 40 such that the conductive bond pads 34 included in the second active surface 32 are aligned with conductive contacts 46 on the second surface 44 of the intermediate substrate 40. Topographic contacts 12 extend between the conductive bond pads 34 of the second active surface 32 and the conductive contacts 46 of the second surface 44 of the intermediate substrate 40.

Figure 7:
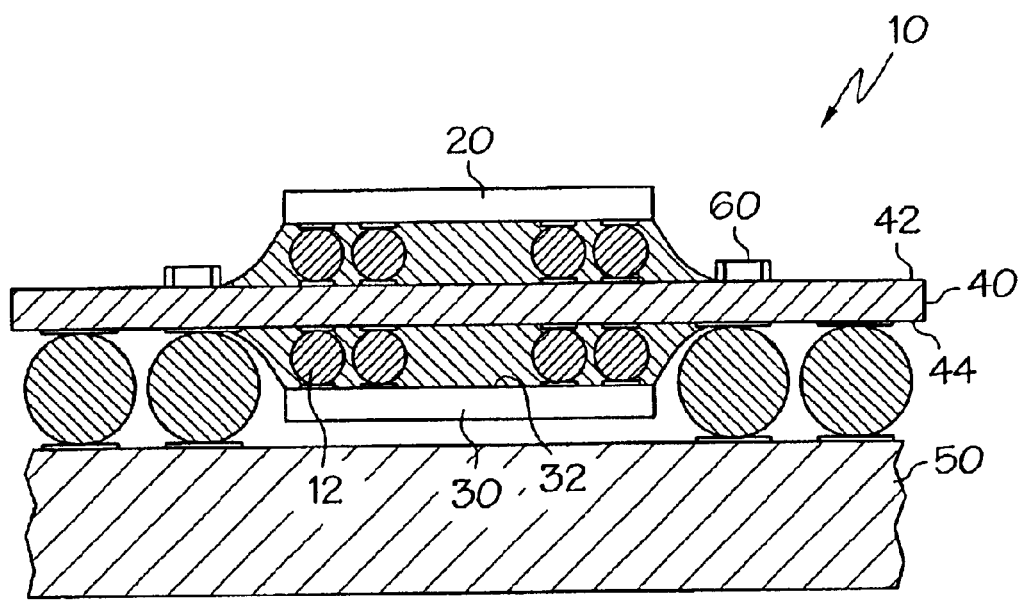

The arrangement of FIG. 7 is similar to that illustrated in FIG. 1, with the exception that the second semiconductor die 30 comprises a flip chip. As such, an additional set of topographic contacts 12 extend from the second active surface 32 to the second surface 44 of the intermediate substrate 40.

Figure 4:
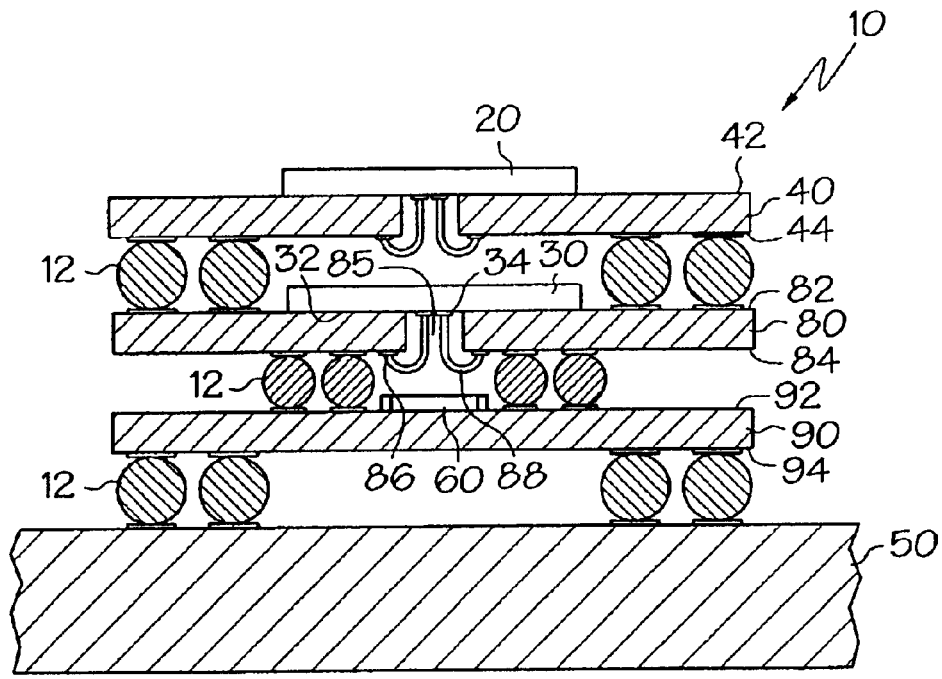
Figure 5:
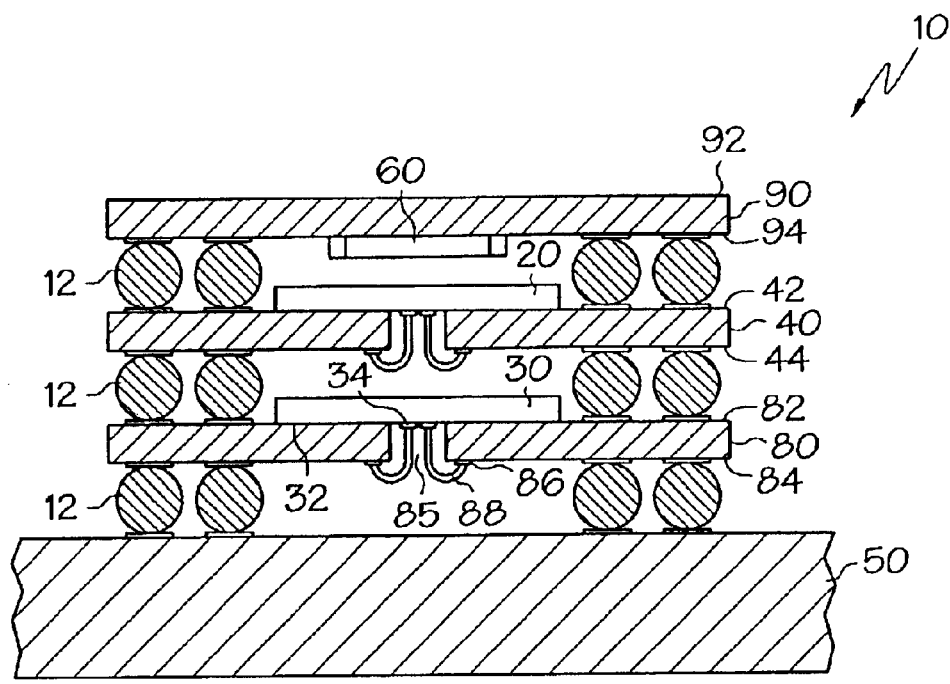
Figure 6:
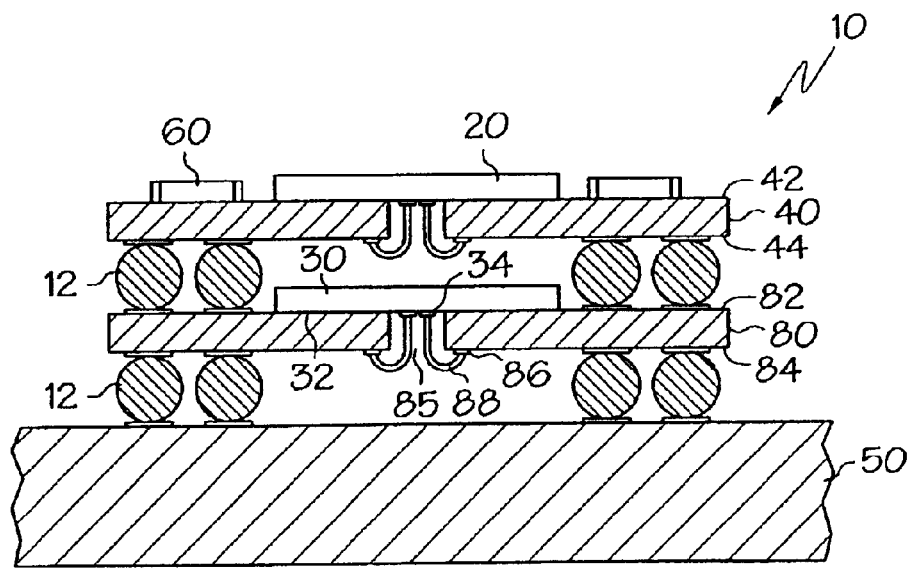

Referring now to FIGS. 4–6, an additional substrate 80 is positioned such that a first surface 82 of the additional substrate 80 faces the second active surface 32 of the second semiconductor die 30. The additional substrate 80 defines an additional passage 85 there through. The second semiconductor die 30 is secured to the first surface 82 of the additional substrate 80 such that conductive bond pads 34 of the second semiconductor die 30 are aligned with the additional passage 85. The second semiconductor die 30 is electrically coupled to the additional substrate 80 by conductive lines 88 extending from the conductive bond pads 34 of the second semiconductor die 30 through the additional passage 85 defined in the additional substrate 80 and to a conductive contact 86 on a second surface 84 of the additional substrate 80.

Referring specifically to FIG. 4, the assembly 10 further comprises a third substrate 90 positioned such that a first surface 92 of the third substrate 90 faces the second surface 84 of the additional substrate 80. The additional substrate 80 is electrically coupled to the third substrate 90 by topographic contacts 12 extending from the second surface 84 of the additional substrate 80 to a first surface 92 of the third substrate 90. A decoupling capacitor 60 is mounted to the first surface 92 of the third substrate 90. The thickness dimension of the decoupling capacitor 90 is accommodated in a space defined by a thickness dimension of the topographic contacts 12 extending from the second surface 84 of the additional substrate 80 to a first surface 82 of the third substrate 90.

Referring specifically to FIG. 5, the assembly 10 further comprises a third substrate 90 positioned such that a first surface 42 of the intermediate substrate 40 faces a second surface 94 of the third substrate 90. The intermediate substrate 40 is electrically coupled to the third substrate 90 by topographic contacts 12 extending from the second surface 94 of the third substrate 90 to the first surface 42 of the intermediate substrate 40. The decoupling capacitor 60 is mounted to the second surface 94 of the third substrate 90. As is illustrated in FIG. 5, the thickness dimension of the decoupling capacitor 60 and a thickness dimension of the first semiconductor die 20 are both accommodated in the space defined by the thickness dimension of the topographic contact 12 extending from the second surface 94 of the third substrate 90 to the first surface 42 of the intermediate substrate 40.

Referring specifically to FIG. 6, a pair of decoupling capacitors 60 are mounted to the first surface 42 of the intermediate substrate 40. The thickness dimension of the decoupling capacitors 60 is accommodated in a space defined by a thickness dimension of the first semiconductor die 20. The pair of decoupling capacitors 60 are mounted to the first surface 42 of the intermediate substrate 40. The first semiconductor die 20 is positioned between the pair of decoupling capacitors 60 relative to the first surface 42 of the intermediate substrate 40.

Figure 8:
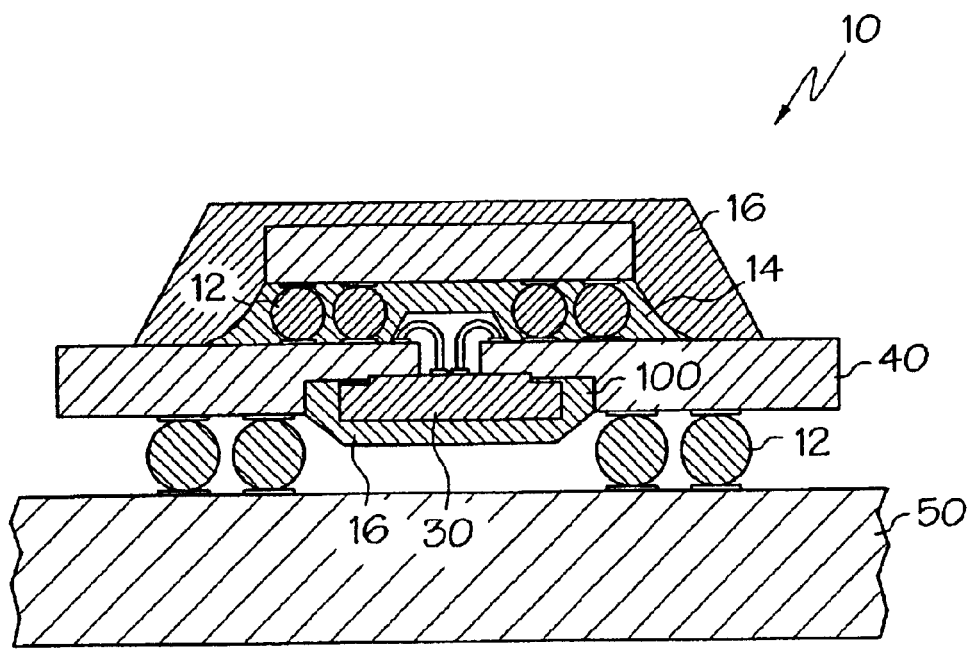

Referring finally to the embodiment of FIG. 8, it is noted that the intermediate substrate 40 may be provided with a cavity 100 defined therein. The dimensions of the cavity 100 are preferably selected to accommodate the second semiconductor die 30. In this manner, the overall thickness of the printed circuit board assembly 10 may be reduced, as compared with the other illustrated embodiments of the present invention. It is contemplated by the present invention that a cavity 100 may be provided in any of the substrates of any of the illustrated embodiments of the present invention without departing form the scope of the present invention. The depth of the cavity is defined by the thickness of the die to be accommodated therein.

Conventional stacking, soldering, bonding, under filling, encapsulating, curing, and other semiconductor processing techniques may be modified and arranged to yield the various stacked structures of the present invention. For the purposes of defining the assembly scheme of the present invention it is noted that any claims to a method of assembling a structure are not intended to be limited by the order in which specific process steps are recited in a claim. Having described the invention in detail and by reference to preferred embodiments thereof, it will be apparent that modifications and variations are possible without departing from the scope of the invention defined in the appended claims.

What is claimed is:

1. A method of stacking a plurality of semiconductor die comprising:

providing a first semiconductor die defining a first active surface, said first active surface including at least one conductive bond pad;

providing a second semiconductor die defining a second active surface, said second active surface including at least one conductive bond pad;

positioning an intermediate substrate between said first active surface of said first semiconductor die and said second active surface of said second semiconductor die such that a first surface of said intermediate substrate faces said first active surface and such that a second surface of said intermediate substrate faces said second active surface;

electrically coupling said first semiconductor die to said intermediate substrate by at least one topographic contact extending from said first active surface to said first surface of said intermediate substrate such that said topographic contact defines a space between said first active surface and said first surface of said intermediate substrate;

securing said second semiconductor die to said second surface of said intermediate substrate such that said conductive bond pad of said second semiconductor die is aligned with a passage formed through said intermediate substrate and such that said second semiconductor die is positioned within a cavity defined in said second surface of said intermediate substrate;

electrically coupling said second semiconductor die to said intermediate substrate by at least one conductive line extending from said conductive bond pad of said second semiconductor die, through said space defined between said first active surface and said first surface of said intermediate substrate, through said passage defined in said intermediate substrate, and to a conductive contact on said first surface of said intermediate substrate;

positioning a printed circuit board such that a first surface of said printed circuit board faces said second surface of said intermediate substrate and such that said second semiconductor die is positioned between said printed circuit board and said intermediate substrate; and forming a plurality of topographic contacts extending from said second surface of said intermediate substrate to said first surface of said printed circuit board.

2. A method of forming a computer system comprising providing a programmable controller and at least one memory unit, wherein said memory unit comprises a printed circuit board assembly that is formed by:

providing a first semiconductor die defining a first active surface, said first active surface including at least one conductive bond pad;

providing a second semiconductor die defining a second active surface, said second active surface including at least one conductive bond pad;

positioning an intermediate substrate between said first active surface of said first semiconductor die and said second active surface of said second semiconductor die such that a first surface of said intermediate substrate faces said first active surface and such that a second surface of said intermediate substrate faces said second active surface;

electrically coupling said first semiconductor die to said intermediate substrate by at least one topographic contact extending from said first active surface to said first surface of said intermediate substrate such that said topograhic contact defines a space between said first active surface and said first surface of said intermediate substrate;

securing said second semiconductor die to said second surface of said intermediate substrate such that said conductive bond pad of said second semiconductor die is aligned with a passage formed through said intermediate substrate and such that said second semiconductor die is positioned within a cavity defined in said second surface of said intermediate substrate;

electrically coupling said second semiconductor die to said intermediate substrate by at least one conductive line extending from said conductive bond pad of said second semiconductor die, through said space defined between said first active surface and said first surface of said intermediate substrate, through said passage defined in said intermediate substrate, and to a conductive contact on said first surface of said intermediate substrate;

positioning a printed circuit board such that a first surface of said printed circuit board faces said second surface of said intermediate substrate and such that said second semiconductor die is positioned between said printed circuit board and said intermediate substrate; and forming a plurality of topographic contacts extending from said second surface of said intermediate substrate to said first surface of said printed circuit board.

3. The method as claimed in claim 1 wherein said first semiconductor die comprises a flip chip arranged relative to said intermediate substrate such that said conductive bond pads included in said first active surface are aligned with conductive contacts on said first surface of said intermediate substrate.

4. The method as claimed in claim 3 further comprising forming topographic contacts extending between said conductive bond pads of said first active surface and said conductive contacts of said first surface of said intermediate substrate.

5. The method as claimed in claim 1 wherein said second semiconductor die comprises a stacked chip secured to said second surface of said intermediate substrate such that said conductive bond pad on said second active surface is aligned with said passage.

6. The method as claimed in claim 5 further comprising providing conductive lines extending from said conductive bond pads on said second active surface to conductive contacts on said first surface of said intermediate substrate.

7. The method as claimed in claim 1 wherein said first semiconductor die is electrically coupled to said second semiconductor die.

8. The method as claimed in claim 1 further comprising providing an underfill material formed between said first semiconductor die and said first surface of said intermediate substrate.

9. The method as claimed in claim 1 further comprising providing an encapsulant formed over said first semiconductor die and said first surface of said intermediate substrate.

10. The method as claimed in claim 9 further comprising providing an underfill material formed between said first semiconductor die and said first surface of said intermediate substrate.

11. The method as claimed in claim 1 further comprising providing an encapsulant formed over said first semiconductor die and said first surface of said intermediate substrate and between said first semiconductor die and said first surface of said intermediate substrate.

12. The method as claimed in claim 1 further comprising providing an encapsulant formed over said second semiconductor die.

13. The method as claimed in claim 1 further comprising providing a die attach adhesive positioned to secure said second semiconductor die to said second surface of said intermediate substrate.

\* \* \* \* \*